(12) United States Patent
Tomokuni et al.

(10) Patent No.: US 12,392,054 B2
(45) Date of Patent: *Aug. 19, 2025

(54) CZ CRUCIBLE WITH A GAP BETWEEN AN INNER QUARTZ CRUCIBLE AND AN OUTER GRAPHITE CRUCIBLE

(71) Applicant: SHIN-ETSU QUARTZ PRODUCTS CO., LTD., Tokyo (JP)

(72) Inventors: Kazuki Tomokuni, Echizen (JP); Yoshinori Ikeda, Echizen (JP)

(73) Assignee: SHIN-ETSU QUARTZ PRODUCTS CO., LTD., Tokyo (JP)

( * ) Notice: Subject to any disclaimer, the term of this patent is extended or adjusted under 35 U.S.C. 154(b) by 121 days.

This patent is subject to a terminal disclaimer.

(21) Appl. No.: 18/018,165

(22) PCT Filed: Jul. 2, 2021

(86) PCT No.: PCT/JP2021/025117
§ 371 (c)(1),
(2) Date: Jan. 26, 2023

(87) PCT Pub. No.: WO2022/024667
PCT Pub. Date: Feb. 3, 2022

(65) Prior Publication Data
US 2023/0265583 A1  Aug. 24, 2023

(30) Foreign Application Priority Data
Jul. 30, 2020 (JP) ................. 2020-129012

(51) Int. Cl.
C30B 35/00 (2006.01)
C30B 15/12 (2006.01)
C30B 29/06 (2006.01)

(52) U.S. Cl.
CPC ............ C30B 35/002 (2013.01); C30B 15/12 (2013.01); C30B 29/06 (2013.01)

(58) Field of Classification Search
CPC ......... C30B 15/00; C30B 15/10; C30B 15/12; C30B 29/00; C30B 29/02; C30B 29/06; C30B 35/00; C30B 35/002
(Continued)

(56) References Cited

U.S. PATENT DOCUMENTS

2003/0084840 A1   5/2003  Todt et al.
2003/0113449 A1*  6/2003  Tsuji ..................... C03B 29/02
                                                    427/376.1
(Continued)

FOREIGN PATENT DOCUMENTS

EP   0 340 941 A1    11/1989
JP   2007186354 A *   7/2007
(Continued)

OTHER PUBLICATIONS

Jan. 31, 2023 International Preliminary Report on Patentability issued in International Application No. PCT/JP2021/025117.
(Continued)

*Primary Examiner* — Kenneth A Bratland, Jr.
(74) *Attorney, Agent, or Firm* — Oliff PLC

(57) ABSTRACT

A CZ crucible for growing a single crystal silicon ingot by a CZ method, where the CZ crucible includes a closed-end cylindrical graphite crucible and a closed-end cylindrical quartz glass crucible disposed inside the graphite crucible, and the CZ crucible includes a gap between an inner surface of a bottom portion of the graphite crucible and an outer surface of a bottom portion of the quartz glass crucible on a central axis of the CZ crucible, the gap keeping the inner surface of the bottom portion of the graphite crucible and the outer surface of the bottom portion of the quartz glass crucible contactless with each other. This provides a CZ crucible that ensures that a closed-end cylindrical quartz glass crucible for growing a single crystal silicon ingot by a
(Continued)

CZ method can be stable and self-supporting when disposed inside a closed-end cylindrical graphite crucible.

9 Claims, 3 Drawing Sheets

(58) Field of Classification Search
USPC ........... 117/11, 13, 200, 206, 208, 213, 928, 117/931–932
See application file for complete search history.

(56) References Cited

U.S. PATENT DOCUMENTS

| | | | |
|---|---|---|---|
| 2010/0126407 A1 | 5/2010 | Kishi et al. | |
| 2010/0162947 A1* | 7/2010 | Harada | C30B 15/10 117/206 |
| 2023/0265579 A1* | 8/2023 | Tomokuni | C30B 29/06 117/213 |

FOREIGN PATENT DOCUMENTS

| | | | |
|---|---|---|---|
| JP | 2007-269533 A | | 10/2007 |
| JP | 2009-298652 A | | 12/2009 |
| JP | 2011-088776 A | | 5/2011 |
| JP | 2011-121842 A | | 6/2011 |
| JP | 2012-017245 A | | 1/2012 |
| JP | 2012017242 A | * | 1/2012 |
| JP | 2012-066969 A | | 4/2012 |
| JP | 2013-139356 A | | 7/2013 |
| JP | 2017-095299 A | | 6/2017 |
| TW | 201245509 A | | 11/2012 |

OTHER PUBLICATIONS

Aug. 3, 2021 Search Report issued in International Application No. PCT/JP2021/025117.
Aug. 13, 2024 Notification of Reasons for Refusal issued in Japanese Application No. 2020-129012.
Aug. 5, 2024 Extended European Search Report issued in Application No. 21851277.0.
Feb. 13, 2025 Office Action issued in Korean Patent Application No. 10-2023-7003115.
Mar. 4, 2024 Office Action and Search Report issued in Taiwanese Patent Application No. 110124717.
Jun. 20, 2025 Office Action issued in Singaporean Patent Application No. 11202300602U.

* cited by examiner

[FIG. 1]
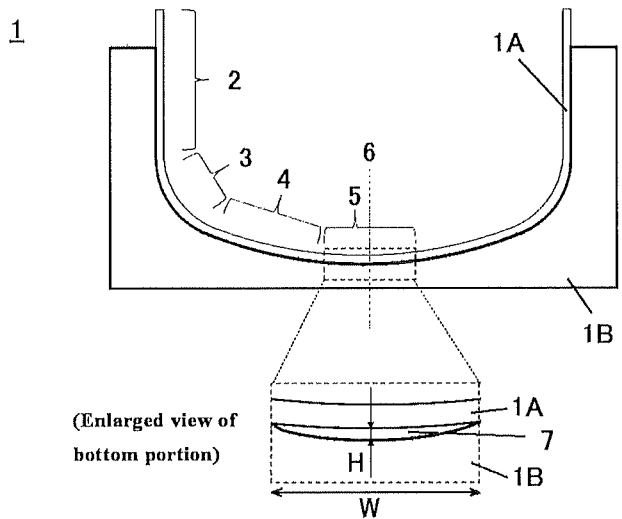
[FIG. 2]
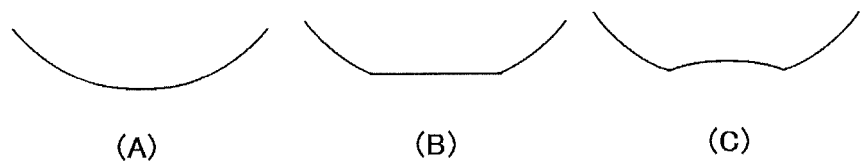
(A)    (B)    (C)
[FIG. 3]
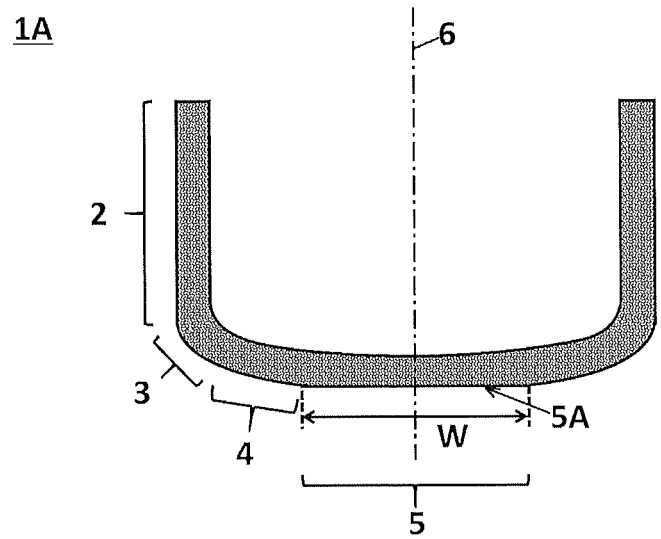

[FIG. 4]
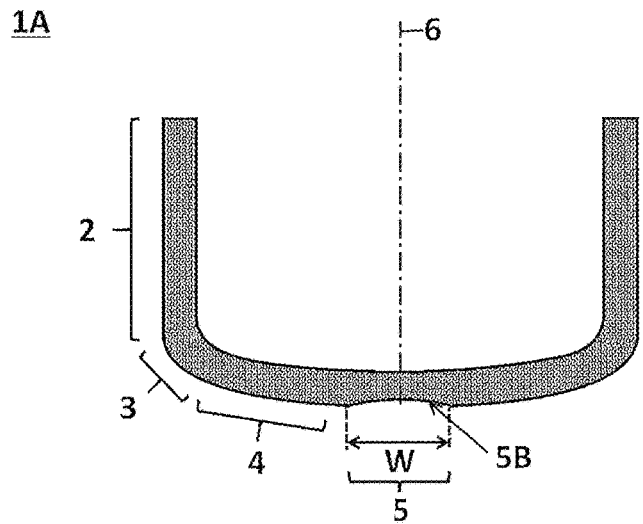
[FIG. 5]
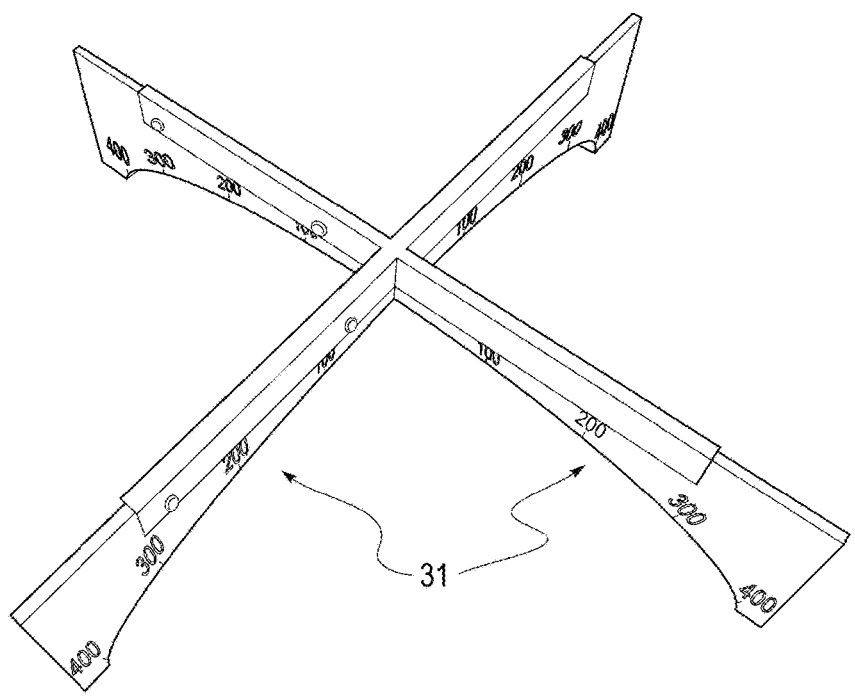
[FIG. 6]
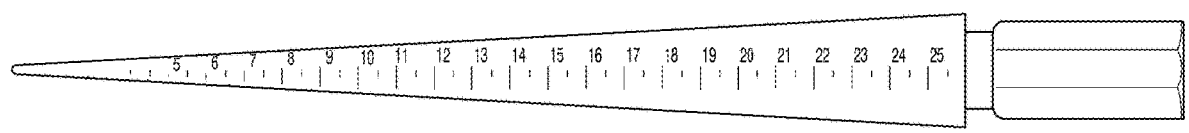

[FIG. 7] RELATED ART
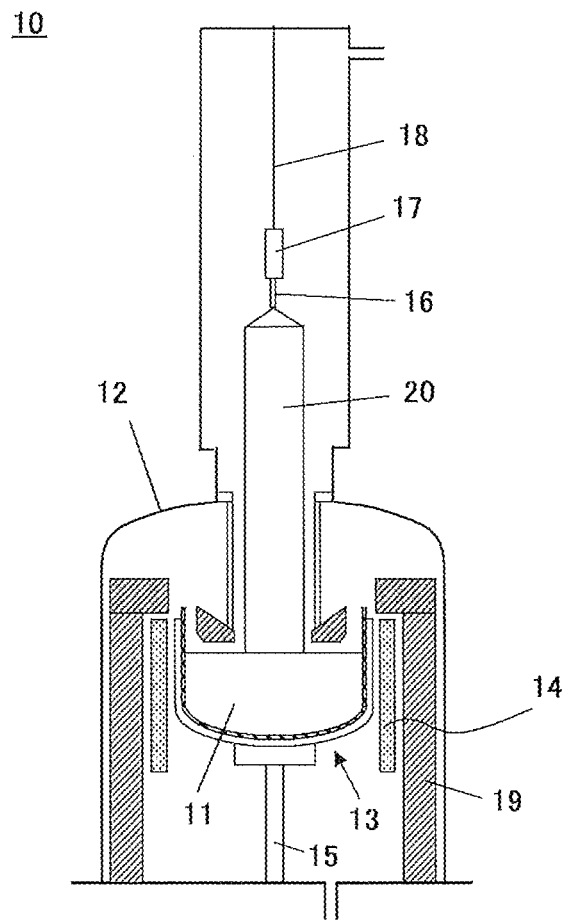
[FIG. 8]
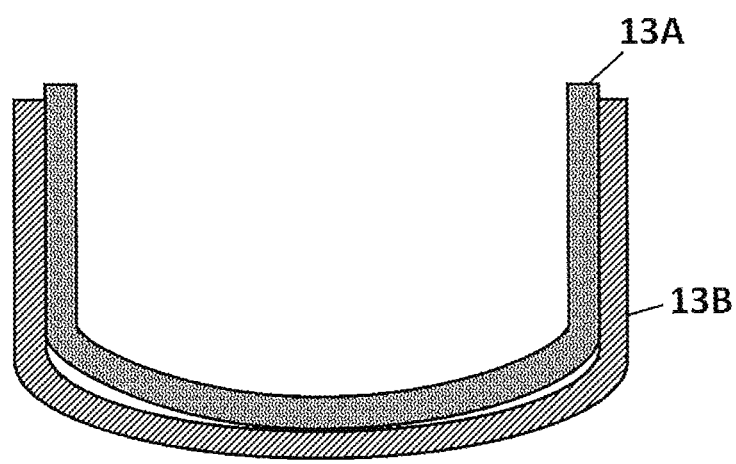

CZ CRUCIBLE WITH A GAP BETWEEN AN INNER QUARTZ CRUCIBLE AND AN OUTER GRAPHITE CRUCIBLE

TECHNICAL FIELD

The present invention relates to a CZ crucible for pulling single crystal silicon by a Czochralski method (hereinafter referred to as the "CZ method").

BACKGROUND ART

The CZ method is known as a method for manufacturing a single crystal. In particular, the CZ method is widely adopted in the industry for most single crystal silicon to be used as materials for semiconductor electronic components. In the CZ method, polycrystalline silicon or the like charged in a quartz glass crucible is melted by a heater, and then a seed crystal is dipped into the surface of this silicon melt, followed by pulling up the seed crystal dipped in the silicon melt while rotating the seed crystal and the quartz glass crucible to grow a single crystal with the same crystal orientation as the seed crystal.

FIG. 7 is a conceptual schematic diagram of a pulling apparatus used to pull a single crystal by the CZ method described above. As shown in FIG. 7, the single crystal pulling apparatus 10 includes a pulling chamber 12, a CZ crucible 13 provided inside the pulling chamber 12, a heater 14 disposed around the CZ crucible 13, a crucible holding shaft 15 and its rotating and lifting mechanism (not shown) for rotating and lifting the CZ crucible 13, a seed chuck 17 for holding a seed crystal 16 of silicon, a wire 18 for pulling the seed chuck 17, and a winding mechanism (not shown) for rotating or winding the wire 18. Further, a heat insulator 19 is disposed around an outer periphery of the heater 14. Single crystal silicon 20 is pulled by the wire 18 from a raw material silicon melt 11.

The CZ crucible 13 disposed inside the single crystal pulling apparatus 10 is composed of a closed-end cylindrical quartz glass crucible containing the silicon melt 11 and a closed-end cylindrical graphite crucible (sometimes referred to as a "carbon susceptor") containing therein the quartz glass crucible (e.g., see Patent Literatures 1 and 2).

CITATION LIST

Patent Literature

Patent Document 1: JP 2012-017245 A
Patent Document 2: JP 2013-139356 A

SUMMARY OF INVENTION

Technical Problem

While a quartz glass crucible is dimensioned to be received inside a graphite crucible, it is difficult to fabricate the quartz glass crucible such that an outer surface thereof is in complete contact with an inner surface of the graphite crucible, due to their fabrication errors and other factors. Earnest studies by the present inventors have revealed that, while the outer surface of the quartz glass crucible is shaped to have a convex curved surface to follow the shape of the inner surface of the graphite crucible, any individual variations, such as manufacturing errors in the shapes of the outer surface of the quartz glass crucible and the inner surface of the graphite crucible, may result in point contact between a bottom portion of the outer surface of the quartz glass crucible 13A and the inner surface of the graphite crucible 13B on a central axis when the quartz glass crucible 13A is disposed inside the graphite crucible 13B to form a CZ crucible 13 as shown in FIG. 8, rendering the quartz glass crucible 13A unstable. Any vibrations of the quartz glass crucible 13A inside the graphite crucible 13B may damage the quartz glass crucible 13A inside the graphite crucible 13B. Additionally, during manufacture of a single crystal, the silicon melt will vibrate to cause melt surface vibrations that make it difficult to pull the single crystal silicon, and what is more, the quartz glass crucible 13A will become eccentric during pulling of the single crystal silicon, making it impossible to supply heat uniformly to the silicon ingot, which leads to quality degradation of the silicon ingot.

To address the above problems, it will be contemplated that compatible quartz glass crucible 13A and graphite crucible 13B are selected and combined to provide a stable CZ crucible. However, this requires a trial-and-error approach to find a compatible combination of the quartz glass crucible 13A and the graphite crucible 13B, which is very inefficient and does not necessarily guarantee achieving a preferable combination.

The present invention has been made to solve the above problems. An object of the present invention is to provide a CZ crucible that ensures that a closed-end cylindrical quartz glass crucible for growing a single crystal silicon ingot by the CZ method can be stable and self-supporting when it is disposed inside a closed-end cylindrical graphite crucible.

Solution to Problem

The present invention has been made to achieve the above object, and provides a CZ crucible for growing a single crystal silicon ingot by a CZ method, wherein the CZ crucible comprises a closed-end cylindrical graphite crucible and a closed-end cylindrical quartz glass crucible disposed inside the graphite crucible, and the CZ crucible includes a gap between an inner surface of a bottom portion of the graphite crucible and an outer surface of a bottom portion of the quartz glass crucible on a central axis of the CZ crucible, the gap keeping the inner surface of the bottom portion of the graphite crucible and the outer surface of the bottom portion of the quartz glass crucible contactless with each other.

Such a CZ crucible ensures that the quartz glass crucible can be stable and self-supporting without having point contact with the graphite crucible when the quartz glass crucible is disposed inside the graphite crucible.

In the CZ crucible, a height of the gap in a direction of the central axis on the central axis of the CZ crucible may be 0.5 mm to 5.0 mm.

With this feature, the quartz glass crucible can be more stable and self-supporting. Additionally, deformation of the quartz glass crucible can be more effectively suppressed.

In the CZ crucible, a size of the gap in a direction perpendicular to the central axis of the CZ crucible may be 60 mm or more in diameter.

With this feature, the quartz glass crucible can be more stable and self-supporting, and installation of the quartz glass crucible is facilitated.

In the CZ crucible, the quartz glass crucible may include a cylindrical straight body portion, a first curved portion continuous with a lower end of the straight body portion and having a first curvature radius R1, a second curved portion continuous with the first curved portion and having a second curvature radius R2, and a bottom portion continuous with the second curved portion, the first curvature radius R1 and the second curvature radius R2 may have a relationship of R1<R2, and an outer surface of the bottom portion may have a flat surface shape perpendicular to a central axis of the quartz glass crucible.

With this feature, even when the bottom portion of the quartz glass crucible is provided with a flat surface, there is little effect on the shape of the inner surface of the quartz glass crucible, resulting in a smaller effect on conditions of the convection flow of the silicon melt during growing of the single crystal silicon ingot by the CZ method.

Advantageous Effects of Invention

As described above, the inventive CZ crucible for pulling single crystal silicon ensures that the quartz glass crucible can be stable and self-supporting when it is disposed inside the graphite crucible.

BRIEF DESCRIPTION OF DRAWINGS

FIG. 1 illustrates an example of a CZ crucible according to the present invention.

FIG. 2 illustrates an example of a shape (cross-section) of a bottom portion of a quartz glass crucible used for the CZ crucible according to the present invention.

FIG. 3 illustrates a preferred example of the quartz glass crucible used for the CZ crucible according to the present invention.

FIG. 4 illustrates another preferred example of the quartz glass crucible used for the CZ crucible according to the present invention.

FIG. 5 illustrates an example of a gap measuring jig for measuring a gap between a quartz glass crucible and a graphite crucible.

FIG. 6 illustrates an example of a taper gauge.

FIG. 7 is a schematic conceptual diagram of a pulling apparatus.

FIG. 8 illustrates an example of a conventional CZ crucible.

DESCRIPTION OF EMBODIMENTS

Hereinafter, the present invention will be described in detail, but the present invention is not limited to the following description.

As described above, a need has existed for a CZ crucible that ensures that a closed-end cylindrical quartz glass crucible for growing a single crystal silicon ingot by the CZ method can be stable and self-supporting when it is disposed inside a closed-end cylindrical graphite crucible.

The present inventors have earnestly studied to achieve the above object and consequently found that it is possible to ensure that a quartz glass crucible can be stable and self-supporting when disposed inside a graphite crucible by employing a CZ crucible for growing a single crystal silicon ingot by the CZ method, where the CZ crucible includes the closed-end cylindrical graphite crucible and the closed-end cylindrical quartz glass crucible disposed inside the graphite crucible, and the CZ crucible includes a gap between an inner surface of a bottom portion of the graphite crucible and an outer surface of a bottom portion of the quartz glass crucible on a central axis of the CZ crucible, the gap keeping the inner surface of the bottom portion of the graphite crucible and the outer surface of the bottom portion of the quartz glass crucible contactless with each other. This finding has led to the completion of the present invention.

A description is given below with reference to the drawings.

First of all, the present inventors investigated why a closed-end cylindrical quartz glass crucible rattles and becomes unstable inside a closed-end cylindrical graphite crucible when disposed inside the graphite crucible in a CZ crucible for growing a single crystal silicon ingot by the CZ method, and revealed that the quartz glass crucible becomes unstable due to point contact between an outer surface of a bottom portion of the quartz glass crucible and an inner surface of a bottom portion of the graphite crucible on a central axis, which is caused by individual variations such as manufacturing errors in the shape of the outer surface of the bottom portion of the quartz glass crucible during its manufacture as described above. Thus, the present inventors have found that the above problems can be solved by providing a gap between the inner surface of the bottom portion of the graphite crucible and the outer surface of the bottom portion of the quartz glass crucible on the central axis of the CZ crucible, where the gap keeps the inner surface of the bottom portion of the graphite crucible and the outer surface of the bottom portion of the quartz glass crucible contactless with each other.

FIG. 1 illustrates an example of a CZ crucible according to the present invention. This CZ crucible 1 includes a closed-end cylindrical graphite crucible 1B and a closed-end cylindrical quartz glass crucible 1A disposed inside the graphite crucible 1B. When the quartz glass crucible 1A is disposed inside the graphite crucible 1B, the CZ crucible 1 includes a gap 7 between an inner surface of a bottom portion of the graphite crucible 1B and an outer surface of a bottom portion of the quartz glass crucible 1A on a central axis 6 of the CZ crucible 1, where the gap 7 keeps the inner surface of the bottom portion of the graphite crucible 1B and the outer surface of the bottom portion of the quartz glass crucible 1A contactless with each other, as shown in an enlarged view of the bottom portion 5. Such CZ crucible 1 avoids point contact (FIG. 8) between the outer surface of the bottom portion of the quartz glass crucible 1A and the inner surface of the bottom portion of the graphite crucible 1B, and preferably, provides surface contact between an outer edge of the bottom portion of the quartz glass crucible 1A and the inner surface of the graphite crucible 1B, ensuring that the quartz glass crucible 1A can be stable and self-supporting when disposed inside the graphite crucible 1B.

The quartz glass crucible 1A and the graphite crucible 1B are not limited to particular shapes as long as their shapes result in such CZ crucible 1. FIG. 2 illustrates examples of the shape (cross-section) of the bottom portion 5 of the quartz glass crucible 1A. As shown in FIG. 2, the cross-sectional shape of the bottom portion 5 may be any of (A) convex, (B) flat, and (C) concave shapes.

FIG. 3 illustrates the quartz glass crucible 1A with the bottom portion of a flat cross-sectional shape shown in FIG. 2B. With the outer surface of the bottom portion 5 of the quartz glass crucible 1A shaped into a flat surface 5A perpendicular to the central axis 6 of the quartz glass crucible 1A (hereinafter simply referred to as a "flat surface"), the gap 7 can be provided in the CZ crucible 1 in a reliable and stable manner.

Also, FIG. 4 illustrates the quartz glass crucible 1A with the bottom portion of a concave cross-sectional shape shown in FIG. 2C. With the outer surface of the bottom portion 5 of the quartz glass crucible 1A shaped into a concave surface 5B concave with respect to the above flat surface 5A as shown in FIG. 4 (hereinafter simply referred to as a "concave surface"), the gap 7 can be provided in the CZ crucible as well. In this case, in terms of ensuring the maximum stability, it is preferred that the concave surface has a shape symmetric about the central axis 6, in other words, an edge of the concave portion has a circular shape centered on the central axis 6 when the quartz glass crucible 1A is viewed in the direction of the central axis 6 from the outer surface of the bottom portion 5.

It is more preferred that the quartz glass crucible 1A further includes a first curved portion 3 continuous with a lower end of a cylindrical straight body portion 2 and having a first curvature radius R1 and a second curved portion 4 continuous with the first curved portion 3 and having a second curvature radius R2, where the first curvature radius R1 and the second curvature radius R2 satisfy the relationship of R1<R2. The quartz glass crucible 1A with such a shape has little effect on the shape of the inner surface of the quartz glass crucible 1A even when the flat surface 5A or the concave surface 5B is formed. Thus, there is little effect on conditions of the convection flow of the silicon melt during growing of a single crystal silicon ingot by the CZ method.

While the first curvature R1 and the second curvature R2 are not limited to particular values, it is preferred that the first curvature R1 is in the range of 100 mm≤R1≤200 mm, and the second curvature R2 is in the range of 800 mm≤R2≤900 mm. With such values, any change or disturbance in conditions of the convection flow of the silicon melt can be suppressed in a more stable manner.

While the mouth diameter of the quartz glass crucible 1A is not limited to a particular value, a larger mouth diameter is particularly preferred in the present invention. For example, the mouth diameter may be 32 inches (about 800 mm) or more.

It is also, of course, possible to adjust the inner surface shape of the graphite crucible 1B in order to provide the gap 7 for keeping the inner surface of the bottom portion of the graphite crucible 1B and the outer surface of the bottom portion of the quartz glass crucible 1A contactless with each other, besides the above method of adjusting the outer surface shape of the bottom portion of the quartz glass crucible 1A. In terms of a smaller effect on thermal conditions during growing of the single crystal silicon ingot, it is preferred to form the CZ crucible 1 with the gap 7 by setting the outer surface shape of the bottom portion of the quartz glass crucible 1A.

The gap 7 is preferably sized to have a height (H in FIG. 1) of 0.5 mm to 5.0 mm in the central axis direction on the central axis 6 of the CZ crucible 1. Considering measurement errors (measurement lower limit) for the height H of the gap 7, setting the height H to 0.5 mm or more can stably guarantee the gap 7. During growing of the single crystal silicon ingot, gas entrapped in the gap 7 may expand and increase the pressure in the gap 7. However, setting the height H to any value within 5.0 mm can reduce the effect of expansion of the gas entrapped in the gap 7, resulting in the CZ crucible 1 that can effectively suppress deformation of the quartz glass crucible 1A.

In addition, the size of a gap in the direction perpendicular to the central axis 6 (W in FIG. 1) is preferably 60 mm or more in diameter. With such size W, the quartz glass crucible 1A is more stably installed inside the graphite crucible 1B, resulting in the CZ crucible 1 with less rattling. Additionally, installation of the quartz glass crucible is facilitated.

Now a description is given of how to estimate the size (height H and width W) of the gap 7. For example, the size of the gap 7 can be estimated by measuring, using a three-dimensional shape measuring device or the like, the outer surface shape of the quartz glass crucible 1A and the inner surface shape of the graphite crucible 1B that are to be actually combined, and then analyzing respective data.

Alternatively, the gap 7 between the inner surface of the bottom portion of the graphite crucible 1B and the outer surface of the bottom portion of the quartz glass crucible 1A on the central axis 6 of the CZ crucible 1 can be easily and reliably measured by using a gap measuring jig 30 as shown in FIG. 5 and a taper gauge as shown in FIG. 6 against the bottom portion of the quartz glass crucible 1A. Specifically, in FIG. 5, portions with a curved surface (cross-sectional shape portions 31 with a gauge) reflect the cross-sectional shape of the inner surface of the graphite crucible 1B. Applying the cross-sectional shape portions 31 onto the outer surface of the bottom portion 5 of the quartz glass crucible 1A creates a gap between the cross-sectional shape portions 31 of the gap measuring jig 30 and the bottom portion of the quartz glass crucible 1A. By measuring the size of this gap, values of the height H and the size W of the gap can be easily obtained. At this time, the conical taper gauge as shown in FIG. 6 is inserted into the gap, and a conical surface of the conical taper gauge is brought into contact with the cross-sectional shape portions 31 and the outer surface of the quartz glass crucible 1A. The height H of the gap 7 can be measured from a position at which the conical surface of the conical taper gauge is in contact with the cross-sectional shape portions and the outer surface of the quartz glass crucible 1A. Performing the measurement in this manner allows for very easy and accurate measurement of the height and diameter of the gap without requiring skill.

EXAMPLE

The present invention is described below in detail using Examples, although these Examples do not limit the present invention.

CZ crucibles shown below were prepared as Comparative Example and Examples and evaluated as to whether the quartz glass crucible could remain self-supporting inside the graphite crucible without rattling. Then, a single crystal silicon ingot was actually grown using the CZ method, and deformation of the quartz glass crucible and degree of disturbance of crystallization (single crystal yield) were evaluated. The single crystal yield is calculated as a ratio of the weight of the single crystal obtained as the product to the weight of the raw material charged. The single crystal yield of Comparative Example 1 was defined to be 1.0 as the norm.

Comparative Example 1

A CZ crucible was prepared that included a quartz glass crucible having a first curved portion with a curvature radius R1 of 180 mm and a second curved portion with a curvature radius R2 of 815 mm, continuous with a straight body portion with a 32 inch (about 800 mm) mouth diameter, and having a bottom portion with a convex surface, where no gap was provided between the bottom portion of the quartz glass crucible and the graphite crucible on the central axis (H=0, W=0).

Example 1

A CZ crucible was prepared that included a quartz glass crucible having a first curved portion with a curvature radius R1 of 180 mm and a second curved portion with a curvature radius R2 of 815 mm, continuous with a straight body portion with a 32 inch (about 800 mm) mouth diameter, and having a bottom portion with a flat surface, where a gap with the size of H=10.0 mm and W=255 mm was provided between the bottom portion of the quartz glass crucible and the graphite crucible.

Example 2

A CZ crucible was prepared under the same conditions as Example 1, except that the size of the gap between the bottom portion of the quartz glass crucible and the graphite crucible was set to H=0.5 mm and W=60 mm.

Example 3

A CZ crucible was prepared that included a quartz glass crucible having a first curved portion with a curvature radius R1 of 180 mm and a second curved portion with a curvature radius R2 of 815 mm, continuous with a straight body portion with a 32 inch (about 800 mm) mouth diameter, and having a bottom portion with a concave surface, where a gap with the size of H=3.0 mm and W=70 mm was provided between the bottom portion of the quartz glass crucible and the graphite crucible.

Example 4

A CZ crucible was prepared under the same conditions as Example 1, except that the size of the gap between the bottom portion of the quartz glass crucible and the graphite crucible was set to H=3.0 mm and W=140 mm.

Example 5

A CZ crucible was prepared under the same conditions as Comparative Example 1, except that the size of the gap between the bottom portion of the quartz glass crucible and the graphite crucible was set to H=3.0 mm and W=440 mm.

Example 6

A CZ crucible was prepared under the same conditions as Example 3, except that the size of the gap between the bottom portion of the quartz glass crucible and the graphite crucible was set to H=1.0 mm and W=30 mm.

Example 7

A CZ crucible was prepared under the same conditions as Example 1, except that the size of the gap between the bottom portion of the quartz glass crucible and the graphite crucible was set to H=5.0 mm and W=180 mm.

As shown in Table 1, it can be seen that the CZ crucible with a gap between the inner surface of the bottom portion of the graphite crucible and the outer surface of the bottom portion of the quartz glass crucible, as in each of Examples, ensures that the quartz glass crucible can be stable and self-supporting when it is disposed inside the graphite crucible.

TABLE 1

| | Contact of bottom portion | Height H of gap (mm) | Diameter W of gap (mm) | Shape of quartz glass crucible bottom portion | Deformation | Self-supporting | Single crystal yield |
|---|---|---|---|---|---|---|---|
| Comp. Ex. 1 | Contact | 0.0 | 0 | Convex surface | good | poor | 1.00 (norm) |
| EX. 1 | Contactless | 10.0 | 255 | Flat surface | fair | good | 1.05 |
| EX. 2 | Contactless | 0.5 | 60 | Flat surface | good | good | 1.09 |
| EX. 3 | Contactless | 3.0 | 70 | Concave surface | fair | good | 1.08 |
| EX. 4 | Contactless | 3.0 | 140 | Flat surface | good | good | 1.09 |
| EX. 5 | Contactless | 3.0 | 440 | Convex surface | good | good | 1.08 |
| EX. 6 | Contactless | 1.0 | 30 | Concave surface | fair | fair | 1.07 |
| EX. 7 | Contactless | 5.0 | 180 | Flat surface | good | good | 1.09 |

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A CZ crucible for growing a single crystal silicon ingot by a CZ method, wherein
the CZ crucible comprises a closed-end cylindrical graphite crucible and a closed-end cylindrical quartz glass crucible disposed inside the graphite crucible,
the CZ crucible includes a gap between an inner surface of a bottom portion of the graphite crucible and an outer surface of a bottom portion of the quartz glass crucible on a central axis of the CZ crucible, the gap keeping the inner surface of the bottom portion of the graphite crucible and the outer surface of the bottom portion of the quartz glass crucible contactless with each other, the outer surface of the bottom portion of the quartz glass crucible has a concave surface shape, and an inner surface of the bottom portion of the quartz glass crucible at a central axis of the quartz glass crucible has a curved concave surface shape.

2. The CZ crucible according to claim 1, wherein a height of the gap in a direction of the central axis on the central axis of the CZ crucible is 0.5 mm to 5.0 mm.

3. The CZ crucible according to claim 1, wherein a size of the gap in a direction perpendicular to the central axis of the CZ crucible is 60 mm or more in diameter.

4. The CZ crucible according to claim 2, wherein a size of the gap in a direction perpendicular to the central axis of the CZ crucible is 60 mm or more in diameter.

5. The CZ crucible according to claim 1, wherein
the quartz glass crucible comprises a cylindrical straight body portion, a first curved portion continuous with a lower end of the cylindrical straight body portion and having a first curvature radius R1, a second curved portion continuous with the first curved portion and having a second curvature radius R2, and a bottom portion continuous with the second curved portion,
the first curvature radius R1 and the second curvature radius R2 have a relationship of R1<R2.

6. The CZ crucible according to claim 2, wherein
the quartz glass crucible comprises a cylindrical straight body portion, a first curved portion continuous with a lower end of the cylindrical straight body portion and having a first curvature radius R1, a second curved portion continuous with the first curved portion and having a second curvature radius R2, and a bottom portion continuous with the second curved portion,
the first curvature radius R1 and the second curvature radius R2 have a relationship of R1<R2.

7. The CZ crucible according to claim 3, wherein
the quartz glass crucible comprises a cylindrical straight body portion, a first curved portion continuous with a lower end of the cylindrical straight body portion and having a first curvature radius R1, a second curved portion continuous with the first curved portion and having a second curvature radius R2, and a bottom portion continuous with the second curved portion,
the first curvature radius R1 and the second curvature radius R2 have a relationship of R1<R2.

8. The CZ crucible according to claim 4, wherein
the quartz glass crucible comprises a cylindrical straight body portion, a first curved portion continuous with a lower end of the cylindrical straight body portion and having a first curvature radius R1, a second curved portion continuous with the first curved portion and having a second curvature radius R2, and a bottom portion continuous with the second curved portion,
the first curvature radius R1 and the second curvature radius R2 have a relationship of R1<R2.

9. The CZ crucible according to claim 1, wherein the concave surface shape is symmetric about the central axis of the CZ crucible.

* * * * *